(12) United States Patent
Hayafuji et al.

(10) Patent No.: US 8,405,302 B2
(45) Date of Patent: Mar. 26, 2013

(54) LIGHT EMITTING APPARATUS WITH AN ORGANIC ELECTROLUMINESCENCE CELL

(75) Inventors: Akinori Hayafuji, Yonezawa (JP); Kenichi Okuyama, Yonezawa (JP)

(73) Assignees: Pioneer Corporation, Tokyo (JP); Tohoku Pioneer Corporation, Tendo, Yamagata (JP)

( * ) Notice: Subject to any disclaimer, the term of this patent is extended or adjusted under 35 U.S.C. 154(b) by 0 days.

(21) Appl. No.: 13/441,634

(22) Filed: Apr. 6, 2012

(65) Prior Publication Data

US 2012/0194063 A1  Aug. 2, 2012

Related U.S. Application Data

(63) Continuation of application No. 12/593,670, filed as application No. PCT/JP2007/057155 on Mar. 30, 2007, now Pat. No. 8,227,974.

(51) Int. Cl.
*H01J 1/62* (2006.01)

(52) U.S. Cl. .................................. 313/504; 313/506
(58) Field of Classification Search .................. 313/498, 313/504, 505, 506, 512
See application file for complete search history.

(56) References Cited

U.S. PATENT DOCUMENTS

| 5,399,936 | A | 3/1995 | Namiki et al. |
| 6,396,208 | B1 | 5/2002 | Oda et al. |
| 2004/0251825 | A1 | 12/2004 | Kato et al. |

FOREIGN PATENT DOCUMENTS

| EP | 1484632 A1 | 12/2004 |
| EP | 1 679 939 A2 | 7/2006 |
| EP | 1 684 550 A1 | 7/2006 |
| JP | 05-307997 A | 11/1993 |
| JP | 11-214162 A | 8/1999 |
| JP | 11-224778 A | 8/1999 |
| JP | 2001-284048 A | 10/2001 |
| JP | 2001-338770 A | 12/2001 |
| JP | 2003-092190 A | 3/2003 |
| JP | 2003-092192 A | 3/2003 |
| JP | 2004-363040 A | 12/2004 |
| JP | 2006-228457 A | 8/2006 |
| JP | 2006-228557 A | 8/2006 |

OTHER PUBLICATIONS

International Search Report for PCT/JP2007/057155, Mailing Date of Jun. 26, 2007.
Machine translation of JP 2001-338770A.
Machine translation of JP 11-224778A.
European Search Report dated May 3, 2012, issued in corresponding Eurpoean Patent Application No. 07740591.8, w/ partial translation.

*Primary Examiner* — Vip Patel
(74) *Attorney, Agent, or Firm* — Westerman, Hattori, Daniels & Adrian, LLP

(57) ABSTRACT

A light emitting apparatus includes a transparent substrate made of glass material, for example, a first electrode layer formed on the substrate, a light emitting functional layer including organic material formed on the first electrode layer, a back surface electrode made of metallic material, for example, as a second electrode layer formed on the light emitting functional layer, and dot-shaped conductors arranged on the first electrode layer. The dot-shaped conductors made of low electric resistivity material are arranged at the first electrode layer. The combined resistance value of the transparent electrode and the plurality of dot-shaped conductors becomes lower than the resistance value of the transparent electrode alone. Therefore, voltage drop occurred at the transparent electrode can be effectively suppressed.

8 Claims, 9 Drawing Sheets

LIGHT EMITTING APPARATUS WITH AN ORGANIC ELECTROLUMINESCENCE CELL

CROSS-REFERENCE TO RELATED APPLICATION

This application is a Continuation of co-pending application Ser. No. 12/593,670 filed on Sep. 29, 2009 and for which priority is claimed under 35 U.S.C. §120. Application Ser. No. 12/593,670 is the national phase of PCT International Application No. PCT/JP2007/057155 filed on Mar. 30, 2007 under 35 U.S.C. §371. The entire contents of each of the above-identified applications are hereby incorporated by reference.

BACKGROUND OF THE INVENTION

1. Field of the Invention

The present invention relates to a light emitting apparatus which utilizes an organic electroluminescence cell as a surface emitting light-source.

2. Description of the Related Art

An organic electroluminescence cell has high luminous efficiency as being driven by direct current of low voltage and is capable of being lightened and thinned. Recently, a product which utilizes organic electroluminescence cells arranging to be dot matrix-shaped, for example, as a display has been provided. Further, not limited to the abovementioned display, the organic electroluminescence cell has been receiving attention in being utilized as a light-source of surface emitting.

A number of patent applications have been filed in utilizing the abovementioned organic electroluminescence cells as light-source of surface emitting. Japanese Patent Application Laid-open No. 2006-228557 and Japanese Patent Application Laid-open No. 2006-228457 are examples of such applications.

It is known that electrons injected from a negative electrode side and positive holes injected from a positive electrode side are recombined in a light emitting functional layer which is sandwiched by both of the electrodes when direct current voltage is applied between the opposing electrodes and that the energy thereof performs light emission as exciting fluorescent material. Accordingly, in order to introduce the light from the light emitting functional layer to the outside, a light permeable electrode (that is, a transparent electrode) is used for at least one of the electrodes.

For example, oxide such as ITO (indium tin oxide) and IZO (indium zinc oxide) is used for the abovementioned transparent electrode. In general, the transparent electrode of the abovementioned ITO and the like is coated on a transparent substrate. Then, the light emitting functional layer which includes organic material is formed on the transparent electrode and the opposing electrode which is made of metallic material, for example, is formed on the light emitting functional layer. Thus, the light from the light emitting functional layer is introduced to the outside of the cell after penetrating the transparent electrode and the substrate.

Here, electric resistivity of the oxide such as ITO and IZO constituting the transparent electrode is approximately $1\times10^{-4}$ Ωcm which is one or two digits higher than electric resistivity of metallic material. Therefore, in a case that a surface emitting light-source of which area is large is formed, large voltage drop occurs at the transparent electrode and unevenness occurs in light emission luminance.

The light emission luminance of the organic electroluminescence cell is to be proportional to current amount injected per unit area of the cell. Therefore, in a case that the transparent electrode is an exhaustive electrode of which area is relatively large, there arises a problem that the luminance becomes low by being affected by the voltage drop at the transparent electrode as being apart from a power supply point against the transparent electrode.

Then, patent applications have been filed for suppressing occurrence of the luminance unevenness by providing auxiliary electrodes of which resistance value is low in order to decrease the voltage drop at the transparent electrode. For example, it has been disclosed in Japanese Patent Application Laid-open No. 2004-134282, Japanese Patent Application Laid-open No. 5-226076 and Japanese Patent Application Laid-open No. 2002-156633.

A configuration of arranging a metallic auxiliary electrode which is formed as a long-shape along the outside of the long side of the transparent electrode is disclosed in Japanese Patent Application Laid-open No. 2004-134282. Further, a configuration of arranging a frame-shaped auxiliary electrode which is made of metallic material, for example, along the periphery of the transparent electrode is disclosed in Japanese Patent Application Laid-open No. 5-226076. Furthermore, a configuration of superposing an auxiliary electrode which is formed as a lattice-shape over the whole transparent electrode is disclosed in Japanese Patent Application Laid-open No. 2002-156633.

However, in the configurations disclosed in Japanese Patent Application Laid-open Nos. 2004-134282, 5-226076, and 2002-156633, there is a problem that luminance difference occurs within a plane between a position where the auxiliary electrode is arranged and a position where the auxiliary electrode is not arranged and even luminance cannot be obtained within the plane. For example, when the auxiliary electrode is formed as a stripe-shape, there arises a problem that a stripe-shaped light variation occurs along the position of auxiliary electrode arrangement.

In order to solve this problem, a surface emitting apparatus (a lighting apparatus) is disclosed in Japanese Patent Application Laid-open No. 2006-19251. In this application, an opening portion is formed by intermittently removing a light emitting functional layer which includes organic material and an opposing electrode portion thereon, and then, positive voltage is applied to a transparent electrode in a spot-like manner via a salient-shaped conductor portion which is connected to the third electrode.

With the configuration of Japanese Patent Application Laid-open No. 2006-19251, it is described that the problem indicated in Japanese Patent Application Laid-open No. 2004-134282 can be solved since positive voltage of the same electric potential is applied to the transparent electrode in a spot-like manner via the third electrode and the salient-shaped conductor portion. However, there remains a problem that the periphery of the position at which the positive voltage is applied in a spot-like manner emits light brightly and the position which is apart from the positive voltage applying point emits light darkly.

Further, with the configuration of Japanese Patent Application Laid-open No. 2006-19251, the light emitting functional layer which includes organic material does not exist at the position at which the salient-shaped conductor portion is located, namely, the position at which the positive voltage is applied in a spot-like manner. Therefore, there is not light emission at this position. Accordingly, there is a problem that the unevenness of the light emission becomes striking due to the non-light-emitting position.

SUMMARY OF THE INVENTION

The present invention provides a light emitting apparatus which utilizes an organic electroluminescence cell as a surface emitting light-source in which, in particular, luminance unevenness caused by high electric resistivity of electrode material can be further decreased.

In order to solve the abovementioned problems, according to a first aspect, a preferable basic embodiment of a light emitting apparatus of the present invention includes a substrate, a first electrode layer formed on the substrate, a light emitting functional layer including organic material formed on the first electrode layer, a second electrode layer formed on the light emitting functional layer, and dot-shaped conductors connected to the first electrode layer. The dot-shaped conductors of the light emitting apparatus are configured, so that a plurality of the dot-shaped conductors are respectively connected to the individual first electrode layer in a state that the dot-shaped conductors are separated from one another.

DESCRIPTION OF THE PREFERRED EMBODIMENTS

Figure 1:
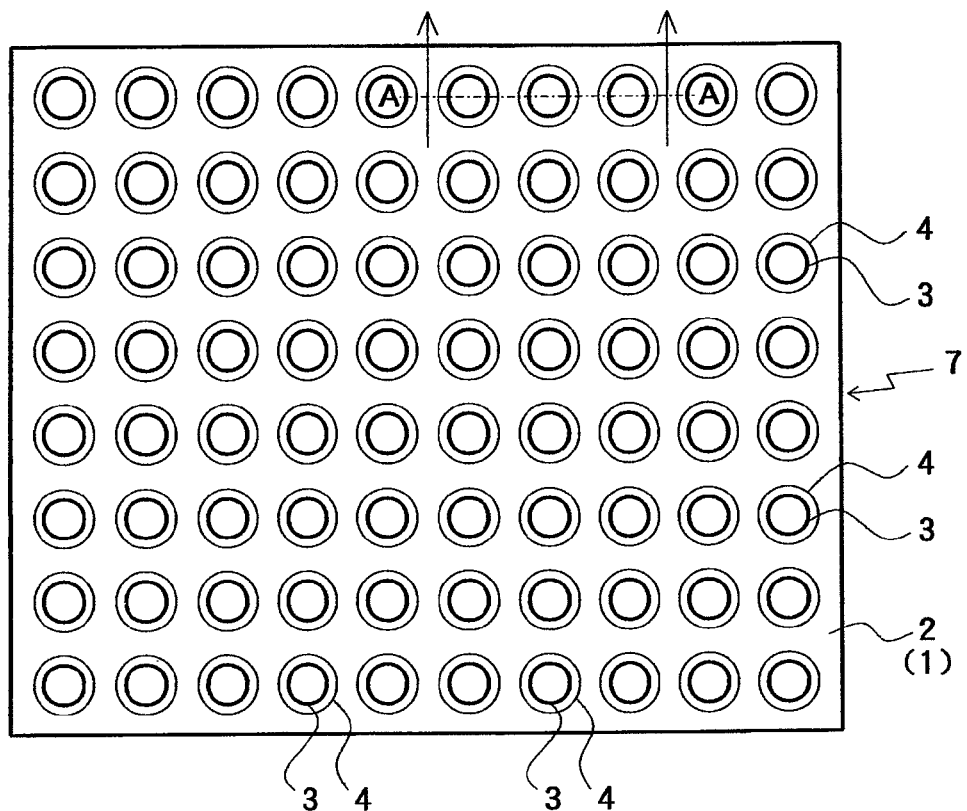
FIG. 1 is a plane view which perspectively illustrates a main part of a basic embodiment of a light emitting apparatus according to the present invention.
Figure 2:
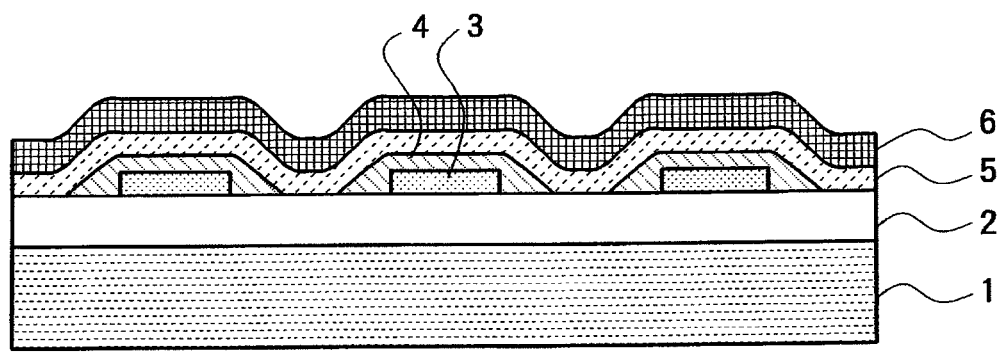
FIG. 2 is a partially enlarged sectional view of the light emitting apparatus viewing in the direction of arrows at A-A line in FIG. 1.

In the following, a light emitting apparatus according to the present invention is described based on embodiments which are illustrated in the drawings. FIG. 1 and FIG. 2 illustrate the first embodiment of the present invention. FIG. 1 is a plane view which illustrates a main part thereof in a perspective state. FIG. 2 is a partially enlarged sectional view in a state viewing in the direction of arrows at A-A line in FIG. 1.

In the light emitting apparatus which is illustrated in FIG. 1 and FIG. 2, a transparent electrode 2 as a first electrode layer is coated to be an exhaustive electrode on a surface of a light permeable substrate 1 (that is, the upper surface of FIG. 2) which is formed of glass, for example. The transparent electrode 2 is made of the material such as the above-mentioned ITO and IZO and coated to the substrate 1 by vapor deposition, for example. Further, dot-shaped conductors 3 are arranged on one surface of the transparent electrode 2, namely, on the transparent electrode 2 which is illustrated in FIG. 2, in a state of being electrically connected to the transparent electrode 2.

It is preferable that the dot-shaped conductors 3 are formed of material of which electric resistivity is lower than the material constituting the transparent electrode 2. In the embodiment illustrated in FIG. 1 and FIG. 2, the dot-shaped conductors 3 are respectively formed to be a circle shape of which diameter is approximately the same as one another and to be a thin film.

For example, paste-shaped metallic material such as silver paste, Mo, Al, Ag, Cr and alloy thereof, and conductive resin can be used for the material constituting the dot-shaped conductors 3. However, the material is not necessarily limited to material of which electric resistivity is lower than the material constituting the transparent electrode 2 and positive hole motive organic material can be also used. The material can be, for example, polyfluorene, polyaniline, polypyrrole, polyalkylthiophene (PAT), poly (PDAF), poly-para-phenylene derivative (MEH-PPV), poly(2,5-dialkoxy-1,4-phenylene): RO-PPV, cyano-substituted-PPV:CN-PPV, poly(2-dimethyloctylsily-1,4-phenylene vinylene):DMOS-PPV, perfluoropropylated-PPP:FP-PPP, poly(2,5-dialkoxy-1,4-phenylene): RO-PPP, or PEDOT/PSS.

Then, the dot-shaped conductors 3 are arranged so that a plurality of the dot-shaped conductors 3 are arranged to the individual transparent electrode 2 in a state of being separated from one another. Accordingly, in this embodiment, the dot-shaped conductors 3 are arranged on the transparent electrode 2 uniformly in the vertical and horizontal directions to be approximately equidistant one another.

Here, the dot-shaped conductors 3 can be formed by vapor deposition with masking. It is also possible to form by utilizing print technology such as an ink-jet method or by utilizing photolithography. Then, it is preferable that each of the dot-shaped conductors 3 is formed to be an extremely thin film shape to the extent through which a part of light emitted from a later-mentioned light emitting functional layer can penetrate respectively.

An insulation film 4 is formed on the upper surface of each of the dot-shaped conductors 3. In the embodiment of FIG. 2, each of the insulation films 4 is formed so as to respectively cover the whole surface of each of the dot-shaped conductors 3 in a state that the insulation films for covering the dot-shaped conductors are separated from one another. Namely, as illustrated in FIG. 1 and FIG. 2, each of the insulation films 4 is configured to concentrically cover each of the dot-shaped conductors 3.

Light permeable material such as polyimide, acrylic and $SiO_2$ can be preferably used as the insulation film 4. In addition, it is also possible to form an optical lens by forming a part of the insulation film 4 to be a curved surface.

The light emitting functional layer 5 is formed so as to cover the transparent electrode 2 and the insulation films 4. The light emitting functional layer 5 may be a single light emitting layer of an organic compound, a double-layer structure composed of an organic hole transport layer and the light emitting layer, a triple-layer structure composed of the organic hole transport layer, the light emitting layer and an organic electron transport layer, or a multiple-layer structure composed of the abovementioned layers to which a hole injection layer and an electron injection layer are added. These layers can be coated by utilizing vapor deposition, for example.

Further, a back surface electrode 6 as a second electrode layer is formed to be laminated as an exhaustive electrode on the light emitting functional layer 5. For example, the back surface electrode 6 is formed of metallic material such as aluminum alloy which can be laminated by utilizing vapor deposition and the like.

Thus, in the light emitting apparatus of the configuration which is illustrated in FIG. 1 and FIG. 2, light emission can be performed at the light emitting functional layer 5 by supplying a predetermined drive current between the transparent electrode 2 as the first electrode layer, for example, to be a positive terminal and the back surface electrode 6 as the second electrode layer to be a negative terminal. The light is introduced to the outside via the substrate 1 after appropriately penetrating the insulation film 4, the dot-shaped conductor 3 and the transparent electrode 2. In this manner, the light emitting apparatus with a surface emitting light-source can be actualized.

In this case, since the plurality of dot-shaped conductors 3 are contacted to the transparent electrode 2, the combined resistance value of the transparent electrode 2 and the plurality of dot-shaped conductors 3 is lower than the resistance value of the transparent electrode 2 alone. Accordingly, voltage drop occurred at the transparent electrode 2 of which electric resistivity is high is effectively suppressed.

Thus, in a case that a power supply portion 7 to the transparent electrode 2 as the first electrode layer is arranged at the right end edge of FIG. 1, for example, the degree of occurrence of the luminance decrement to be darkened as being apart from the power supply portion 7 (that is, toward the left from the right in FIG. 1) can be effectively suppressed.

In addition, the occurrence of the unevenness of the light emission caused by the dot-shaped conductors 3 can be decreased by forming the dot-shaped conductors 3 to be a thin film shape to the extent through which a part of light emitted from the light emitting functional layer 5 can penetrate. Accordingly, the light emitting apparatus which can emit light evenly as a whole can be obtained.

Figure 3:
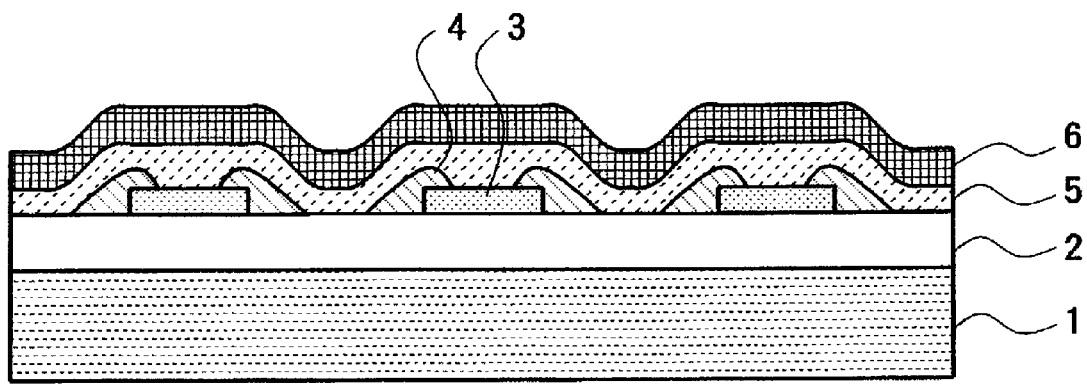
FIG. 3 is a partially enlarged sectional view which illustrates the second embodiment of the light emitting apparatus according to the present invention.

FIG. 3 illustrates the second embodiment of the light emitting apparatus according to the present invention. FIG. 3 is a partially enlarged sectional view as similar to FIG. 2. Here, in FIG. 3, the same numeral is given to the portion which performs the same function as the structure of FIG. 2 and the detailed description thereof is omitted.

In the configuration of FIG. 3, the insulation film 4 for covering the dot-shaped conductor 3 covers the edge part of the dot-shaped conductor 3, namely, the edge part at the periphery of the dot-shaped conductor 3 which is formed to be circular. Thus, the insulation film 4 is not formed at the center part of the dot-shaped conductor 3.

With the configuration of FIG. 3, since at least the edge part of the dot-shaped conductor 3 is covered by the insulation film 4, the occurrence of leakage from the edge part of the dot-shaped conductor 3 to the back surface electrode 6 as the second electrode layer can be effectively prevented even in a case that slight coating failure occurs at the light emitting functional layer 5, for example. In addition, also with the configuration of FIG. 3, the optical lens can be formed by forming a part of the insulation film 4 to be a curved surface.

With the configuration of FIG. 3, the insulation film 4 is not formed at the center part of the dot-shaped conductor 3. The center part of the dot-shaped conductor 3 is opposed to the back surface electrode 6 as the second electrode layer via the light emitting functional layer 5. Therefore, the light emitting can be performed also at the light emitting functional layer 5 which is contacted to the center part of the dot-shaped conductor 3. Since a part of the light is introduced to the outside after penetrating the dot-shaped conductor 3, luminous efficiency can be improved.

Figure 4:
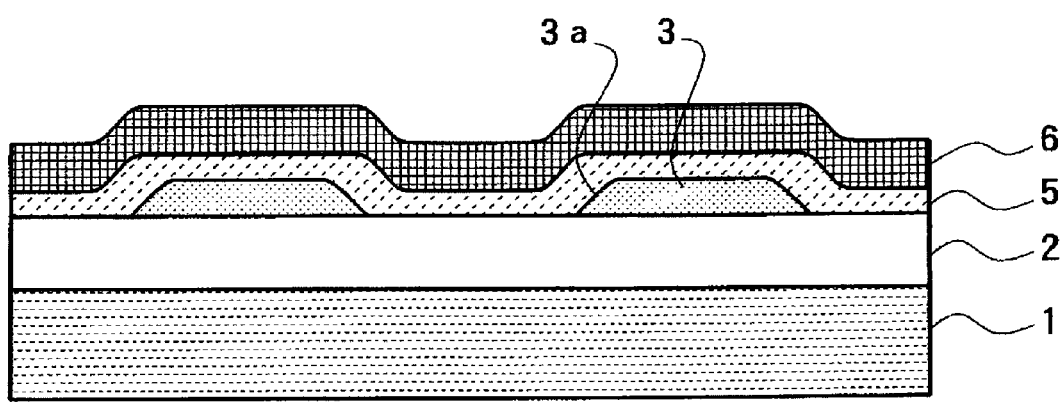
FIG. 4 is a partially enlarged sectional view which illustrates the third embodiment of the light emitting apparatus according to the present invention.

FIG. 4 illustrates the third embodiment of the light emitting apparatus according to the present invention. FIG. 4 is a partially enlarged sectional view as similar to FIG. 2. Here, in FIG. 4, the same numeral is given to the portion which performs the same function as the structure of FIG. 2 and the detailed description thereof is omitted.

In the configuration of FIG. 4, a slant surface 3a is formed at the edge part of the dot-shaped conductor 3, namely, the periphery of the dot-shaped conductor 3 which is formed to be circular. With this configuration, the occurrence of leakage from the periphery of the dot-shaped conductor 3 to the back surface electrode 6 as the second electrode layer can be effectively prevented even in a case that slight coating failure occurs at the light emitting functional layer 5, for example. Accordingly, with the configuration of FIG. 4, the insulation film for covering the dot-shaped conductor 3 can be unnecessary.

Here, the slant surface 3a is formed at the periphery of the dot-shaped conductor 3 in the configuration of FIG. 4. However, the similar effect can be obtained even when the periphery is formed to be a curved surface shape.

Figure 5:
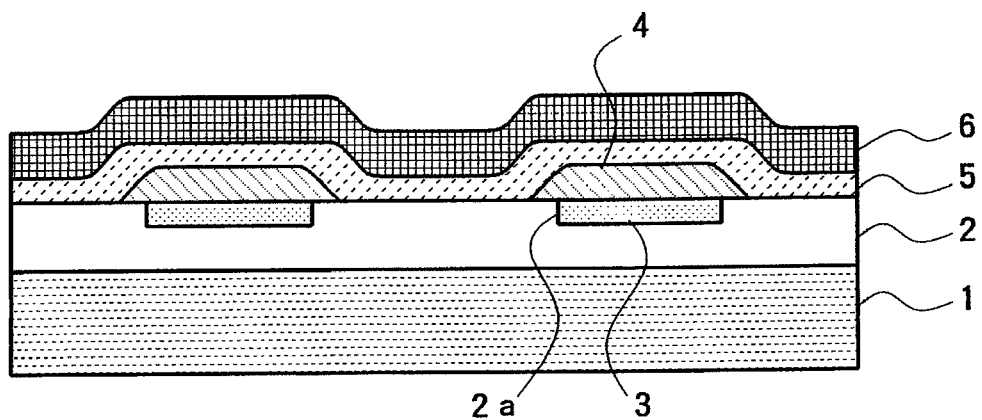
FIG. 5 is a partially enlarged sectional view which illustrates the fourth embodiment of the light emitting apparatus according to the present invention.

FIG. 5 illustrates the fourth embodiment of the light emitting apparatus according to the present invention. FIG. 5 is also a partially enlarged sectional view as similar to FIG. 2. Here, in FIG. 5, the same numeral is given to the portion which performs the same function as the structure of FIG. 2 and the detailed description thereof is omitted.

In the configuration of FIG. 5, each of the dot-shaped conductors 3 is respectively arranged in a concave portion 2a which is formed on the surface of the transparent electrode 2 constituting the first electrode layer. Then, in the embodiment of FIG. 5, the upper surface of the dot-shaped conductor 3 which is accommodated in the concave portion 2a is configured to be covered by the insulation film 4.

With the configuration of FIG. 5, the problem of occurrence of the leakage between the dot-shaped conductor 3 and the back surface electrode 6 can be remarkably resolved. In addition, with this configuration, the occurrence of the abovementioned leakage can be effectively prevented even without the insulation film 4.

Figure 6:
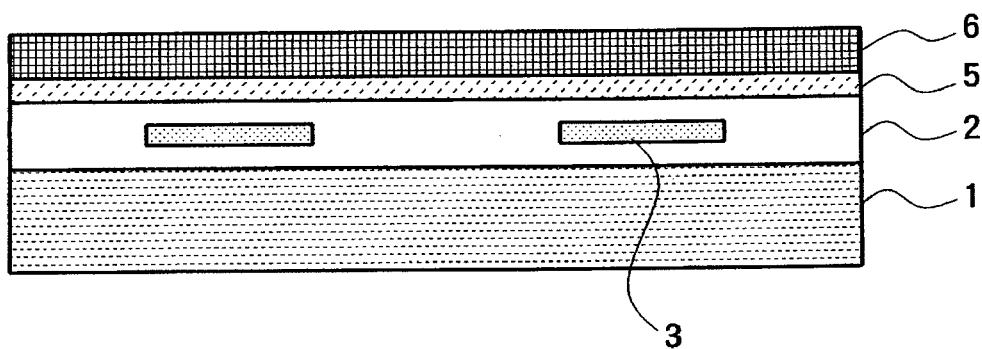
FIG. 6 is a partially enlarged sectional view which illustrates the fifth embodiment of the light emitting apparatus according to the present invention.

FIG. 6 illustrates the fifth embodiment of the light emitting apparatus according to the present invention. FIG. 6 is also a partially enlarged sectional view as similar to FIG. 2. Here, in FIG. 6, the same numeral is given to the portion which performs the same function as the structure of FIG. 2 and the detailed description thereof is omitted.

In the configuration of FIG. 6, the dot-shaped conductor 3 is arranged within the transparent electrode 2 as the first electrode layer. Namely, the dot-shaped conductor 3 is embedded in the transparent electrode 2. With this configuration, the occurrence of the abovementioned leakage can be effectively prevented as well.

Figure 7:
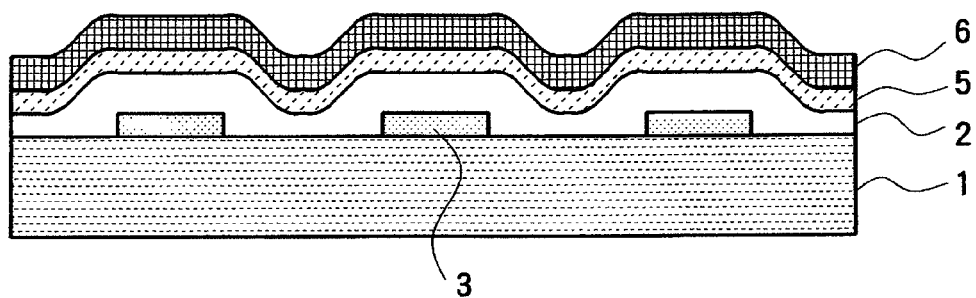
FIG. 7 is a partially enlarged sectional view which illustrates the sixth embodiment of the light emitting apparatus according to the present invention.

FIG. 7 illustrates the sixth embodiment of the light emitting apparatus according to the present invention. FIG. 7 is also a partially enlarged sectional view as similar to FIG. 2. Here, in FIG. 7, the same numeral is given to the portion which performs the same function as the structure of FIG. 2 and the detailed description thereof is omitted.

In the configuration of FIG. 7, the dot-shaped conductor 3 is arranged between the substrate 1 and the transparent electrode 2 as the first electrode layer. With this configuration, the effect similar to the configuration of FIG. 6 can be also obtained. Here, in the configuration of FIG. 7, it is also possible to form the insulation film which covers at least a part of the dot-shaped conductor 3.

Figure 8:
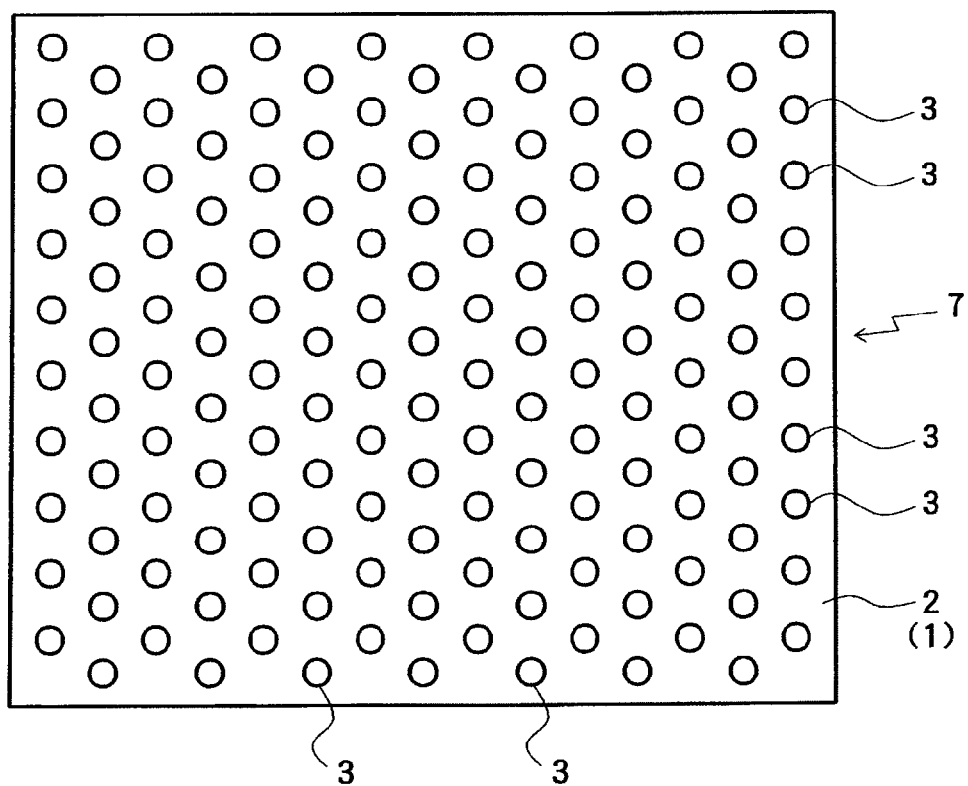
FIG. 8 is a plane view which perspectively illustrates a main part of another example in which arrangement of the dot-shaped conductors of the light emitting apparatus according to the present invention is modified.

FIG. 8 illustrates a preferable arrangement of the dot-shaped conductors of the light emitting apparatus according to the present invention. FIG. 8 is a plane view which perspectively illustrates a main part as similar to FIG. 1 described above. The example of FIG. 8 is illustrated at the enlargement ratio which is lower than that of the example of FIG. 1. In this example, the dot-shaped conductors 3 which are formed to be of approximately the same diameter are arranged at the transparent electrode 2 in a state of being shifted by a half pitch for every line. Here, the example of FIG. 8 is illustrated in a state that the insulation film for covering the dot-shaped conductor 3 is not formed. The arrangement of the dot-shaped conductors of FIG. 8 can be adopted to each of the embodiments of FIGS. 2 to 7 described above.

In the arrangements of the dot-shaped conductors 3 of FIG. 1 and FIG. 8, the dot-shaped conductors 3 which are formed to be of approximately the same diameter are arranged at approximately the same pitches from one another. In this case, it is also possible to form the dot-shaped conductors 3 so that the thickness thereof varies in accordance with the distance from the power supply portion 7 to the transparent electrode 2 as the first electrode layer.

By forming the dot-shaped conductors 3 to be thicker as being apart from the power supply portion 7 to the transparent electrode 2, the combined resistance value of the transparent electrode 2 and the dot-shaped conductors per unit area can be decreased as being apart from the power supply portion 7. Accordingly, the degree of occurrence of the luminance decrement to be darkened as being apart from the power supply portion 7 can be suppressed.

Figure 9:
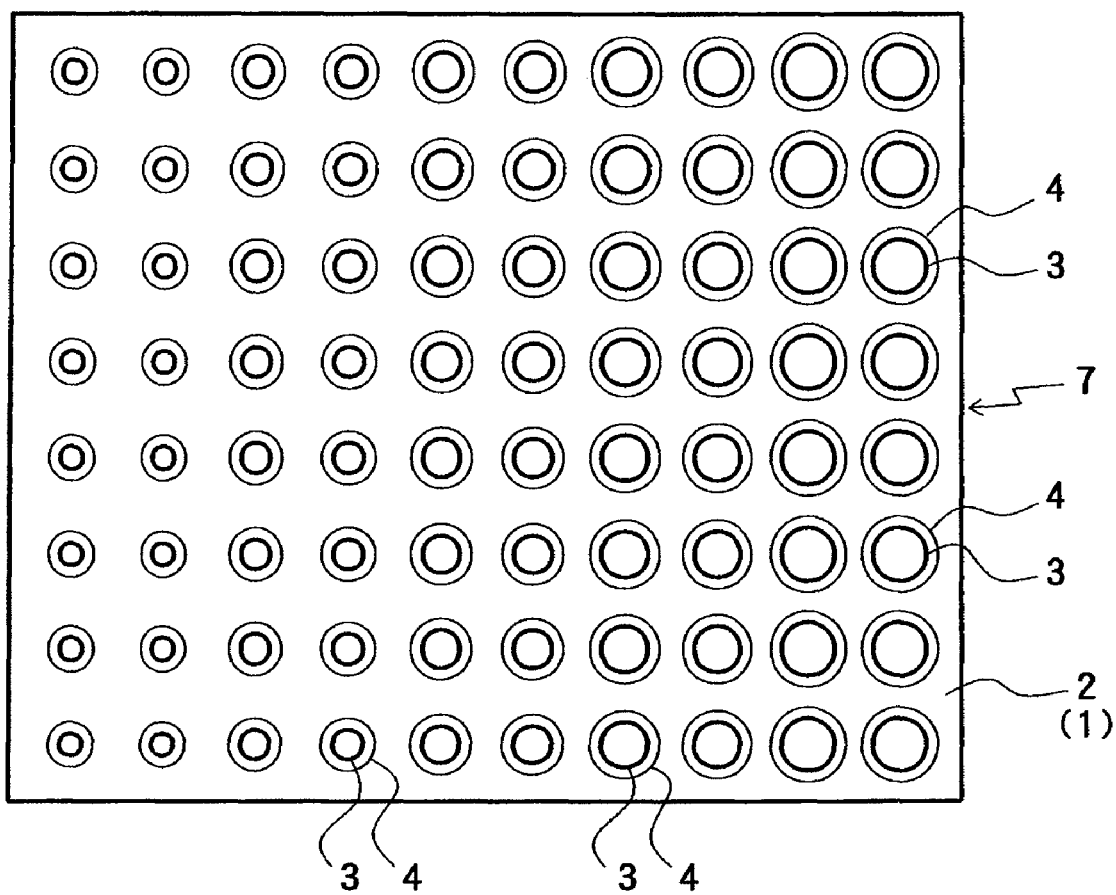
FIG. 9 is a plane view which perspectively illustrates a main part of another example in which arrangement of the dot-shaped conductors is modified.

FIG. 9 illustrates another preferable arrangement of the dot-shaped conductors of the light emitting apparatus according to the present invention. FIG. 9 is a plane view which perspectively illustrates a main part as similar to FIG. 1 described above. In the configuration of FIG. 9, the dot-shaped conductors 3 are arranged at the transparent electrode 2 uniformly in the vertical and horizontal directions as similar to the example of FIG. 1.

In the configuration of FIG. 9, each of the dot-shaped conductors 3 is formed so that the diameter thereof becomes smaller as being apart from the power supply portion 7 at the right end edge of the transparent electrode 2. Here, the insulation film 4 covers the dot-shaped conductor 3.

In the abovementioned arrangement configuration of the dot-shaped conductor, the dot-shaped conductors 3 of which areas are large are arranged in the close section to the power supply portion 7 of the transparent electrode 2 and the dot-shaped conductors 3 of which areas are small are arranged in the distant section from the power supply portion 7. As described above, the respective dot-shaped conductors 3 are formed to be thin film shapes to the extent through which a part of light emitted from the light emitting functional layer 5 can penetrate. However, it is unavoidable that a part of the light is absorbed by the dot-shaped conductors 3.

Accordingly, with the configuration of FIG. 9, the absorbed amount of the light by the dot-shaped conductors 3 is large in the close section to the power supply portion 7 and is small in the distant section from the power supply portion 7. The abovementioned acts to counterbalance the occurrence of luminance decrement caused by the wiring resistance of the transparent electrode 2. In this manner, surface emitting characteristics are ensured further evenly. Here, the arrangement of the dot-shaped conductors of FIG. 9 can be adopted to each of the embodiments of FIGS. 2 to 7 described above.

In the configuration of FIG. 9, in a case that the whole surface of each of the dot-shaped conductors 3 is covered by the insulation film 4, the light emitting functional layer 5 does not emit light at the positions where the dot-shaped conductors 3 are arranged. In a case of the configuration that the diameter of each of the dot-shaped conductors 3 becomes smaller as being apart from the power supply portion 7 as illustrated in FIG. 9, there also occurs an effect that the area of parts where light emission is not performed becomes substantially small as being apart from the power supply portion 7. Therefore, by utilizing this effect, it is possible that the occurrence of luminance decrement caused by the wiring resistance of the transparent electrode 2 can be counterbalanced.

Figure 10:
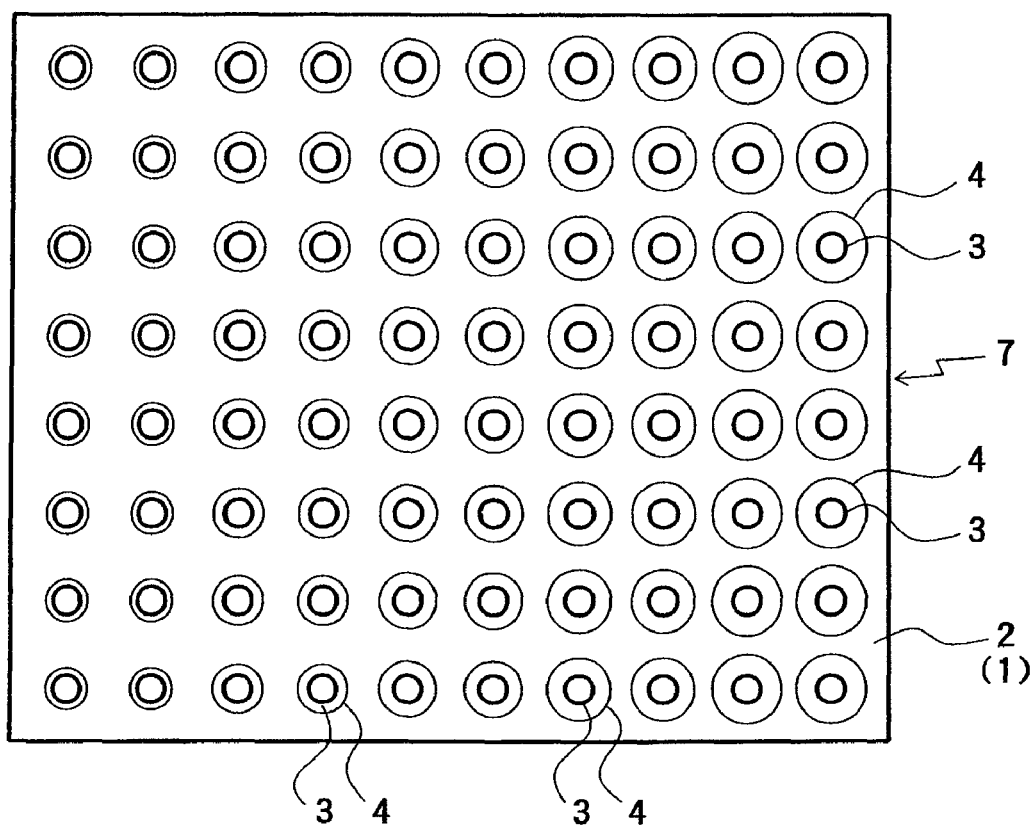
FIG. 10 is a plane view which perspectively illustrates a main part of another example in which arrangement of the dot-shaped conductors is modified.

FIG. 10 illustrates another preferable arrangement of the dot-shaped conductors of the light emitting apparatus according to the present invention. FIG. 10 is a plane view which perspectively illustrates a main part as similar to FIG. 1 described above. In the example of FIG. 10, the dot-shaped conductors 3 are respectively formed to be of approximately the same area and are arranged at the transparent electrode 2 uniformly in the vertical and horizontal directions as similar to the example of FIG. 1.

In the configuration of FIG. 10, each of the insulation films 4 which covers each of the dot-shaped conductors 3 is formed so that the area (that is, the diameter) thereof becomes smaller as being apart from the power supply portion 7 at the right end edge of the transparent electrode 2. By constituting the insulation films 4 as mentioned above, the area of parts where light emission is not performed becomes substantially small as being apart from the power supply portion 7. Therefore, it is possible that the occurrence of luminance decrement caused by the wiring resistance of the transparent electrode 2 can be counterbalanced. Here, the arrangement of the dot-shaped conductors of FIG. 10 can be adopted to each of the embodiments of FIGS. 2 to 7.

Figure 11:
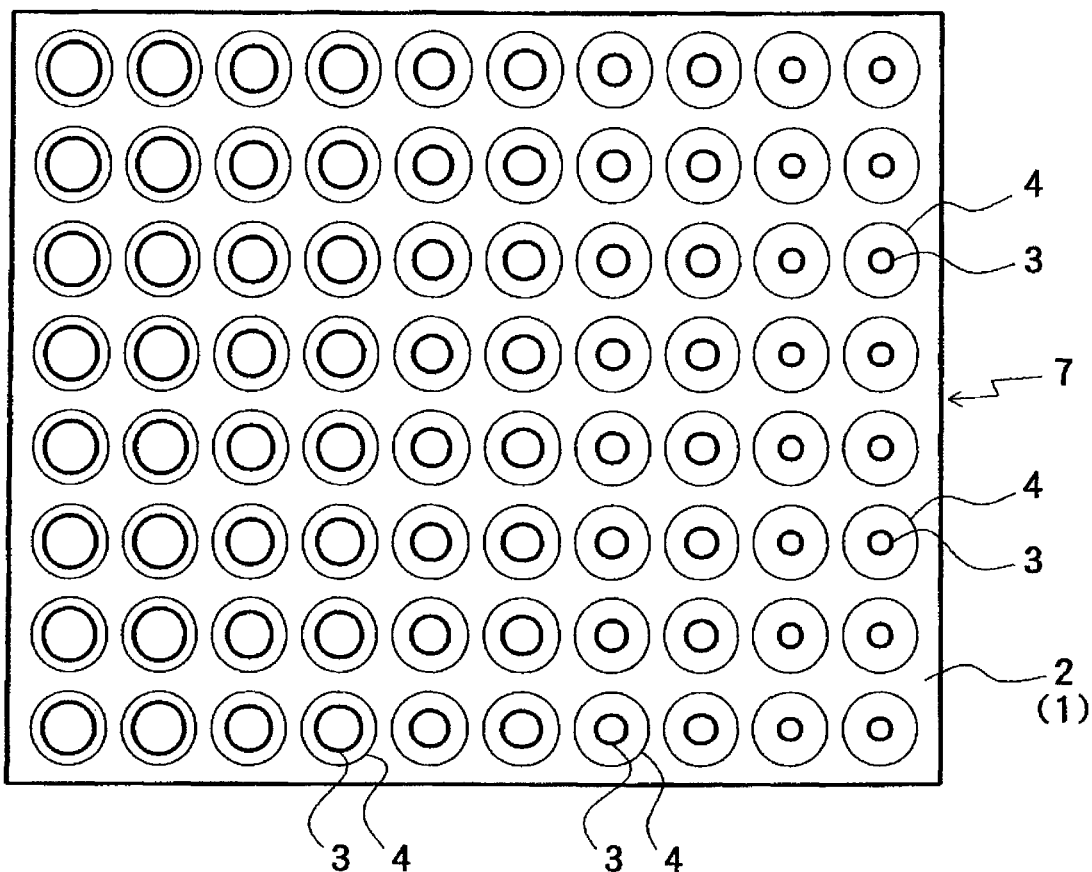
FIG. 11 is a plane view which perspectively illustrates a main part of another example in which arrangement of the dot-shaped conductors is modified.

FIG. 11 illustrates another preferable arrangement of the dot-shaped conductors of the light emitting apparatus according to the present invention. FIG. 11 is a plane view which perspectively illustrates a main part as similar to FIG. 1 described above. In the example of FIG. 11, the insulation films 4 are respectively formed to be of approximately the same area and each of the dot-shaped conductors 3 is formed so that the area (that is, the diameter) thereof becomes large as being apart from the power supply portion 7 of the right end edge of the transparent electrode 2.

By abovementioned combination of the dot-shaped conductors 3 and the insulation films 4, only the combined resistance value of the transparent electrode 2 and the dot-shaped conductors per unit area can be decreased as being apart from the power supply portion 7 while maintaining the light emitting area constant. Therefore, the luminance decrement caused by the wiring resistance of the transparent electrode 2 can be counterbalanced and the light emitting can be evenly performed without variation of light emitting area. Here, the combination of the dot-shaped conductors 3 and the insulation films 4 which is illustrated in FIG. 11 can be adopted to each of the embodiments of FIGS. 2 to 7 described above.

Figure 12:
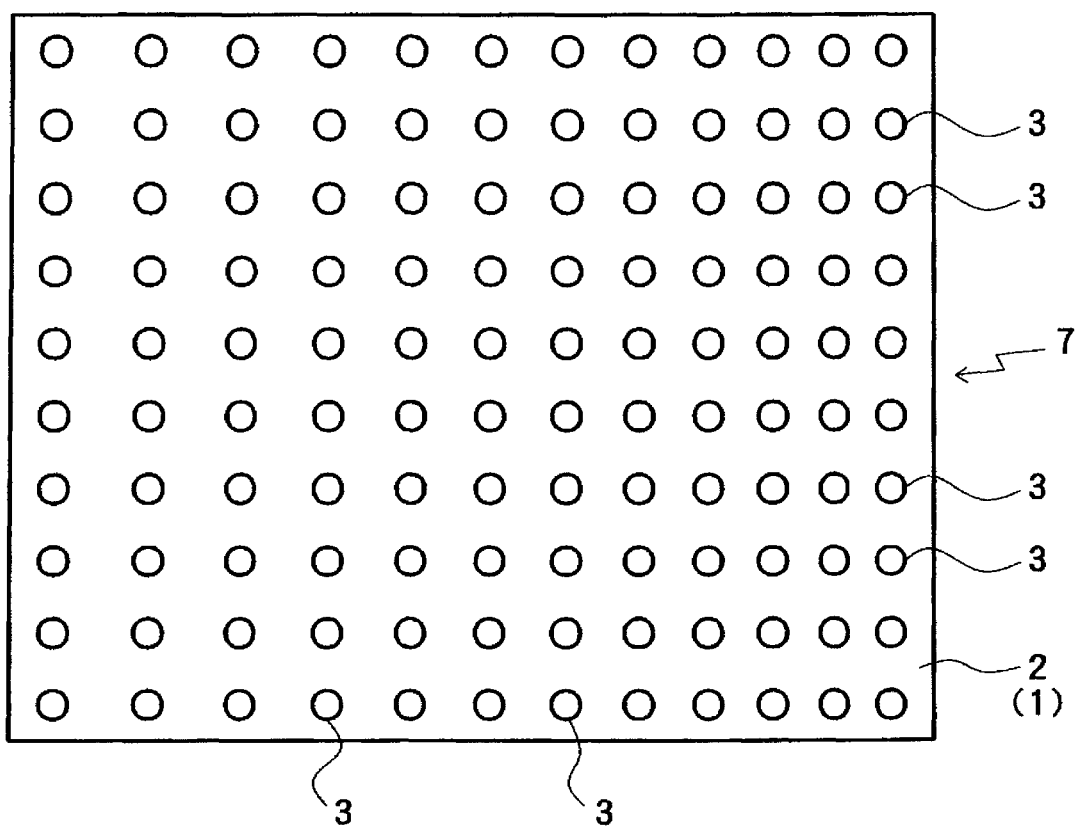
FIG. 12 is a plane view which perspectively illustrates a main part of still another example in which arrangement of the dot-shaped conductors is modified.

FIG. 12 illustrates still another preferable arrangement of the dot-shaped conductors of the light emitting apparatus according to the present invention. FIG. 12 is a plane view which perspectively illustrates a main part as similar to FIG. 1 described above. The example of FIG. 12 is illustrated at the enlargement ratio which is lower than that of the example of FIG. 1. In this example, each of the dot-shaped conductors 3 of which diameter is approximately the same is arranged at the transparent electrode 2 and the insulation film for covering the dot-shaped conductor 3 is not formed.

In the configuration of FIG. 12, the dot-shaped conductors 3 are formed so that the arrangement density thereof becomes low as being apart from the power supply portion 7 of the right end edge. Namely, the number of the dot-shaped conductors arranged per unit area varies in accordance with the distance from the power supply portion 7 to the transparent electrode 2.

In the configuration of FIG. 12 as well, the absorbed amount of the light by the dot-shaped conductors 3 is large in the close section to the power supply portion 7 of the transparent electrode 2 and is small in the distant section from the power supply portion 7.

Therefore, in the arrangement configuration of the dot-shaped conductors of FIG. 12, it is also possible to obtain the effect similar to the configuration of FIG. 9. Here, the arrangement of the dot-shaped conductors of FIG. 12 can be also adopted to each of the embodiments of FIGS. 2 to 7.

Figure 13:
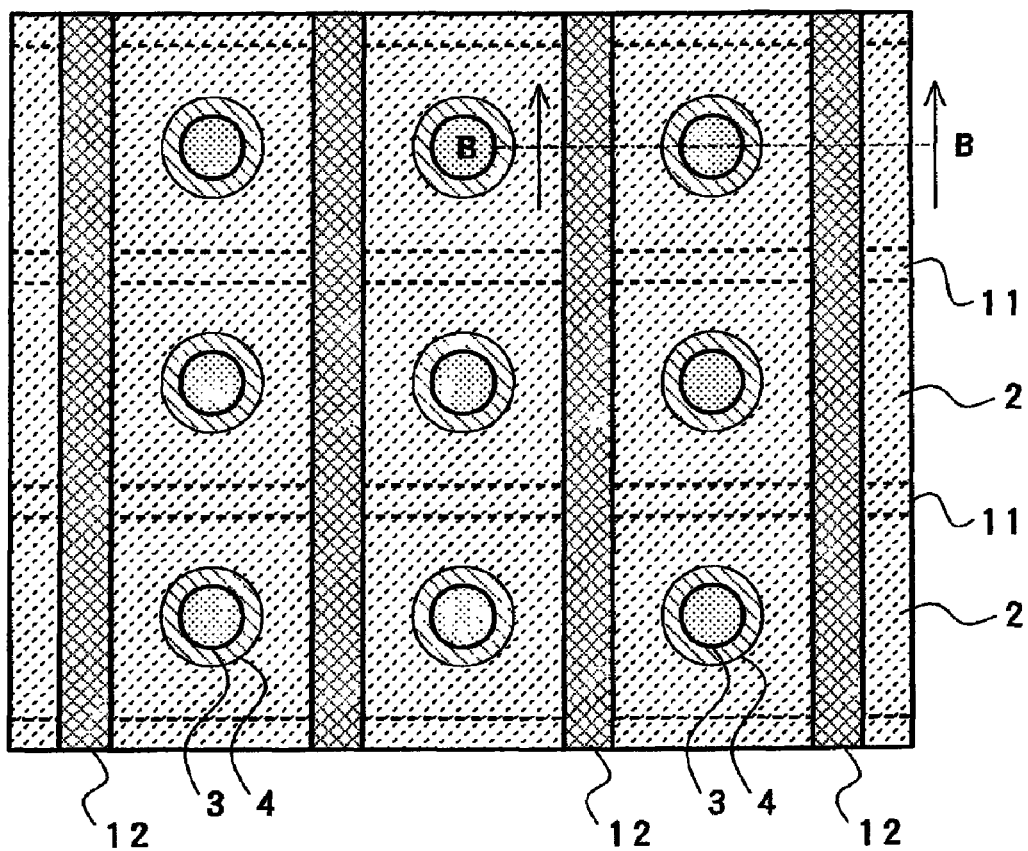
FIG. 13 is a plane view which perspectively illustrates a main part of the seventh embodiment of the light emitting apparatus according to the present invention.
Figure 14:
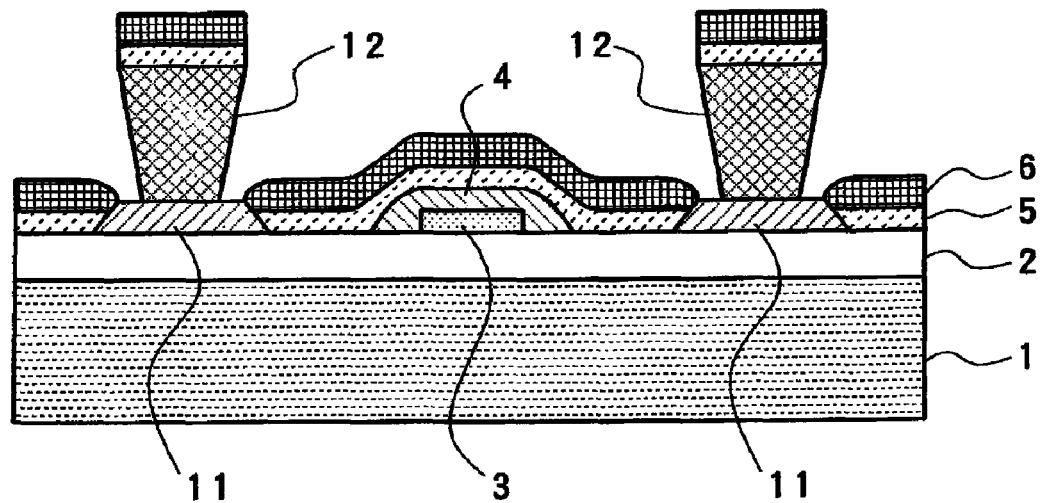
FIG. 14 is a partially enlarged sectional view of the light emitting apparatus viewing in the direction of arrows at B-B line in FIG. 13.

FIG. 13 and FIG. 14 illustrate an example of a passive matrix type organic electroluminescence panel to which the light emitting apparatus according to the present invention is applied. FIG. 13 is a plane view which perspectively illustrates a main part thereof. FIG. 14 is a partially enlarged sectional view viewing in the direction of arrows at B-B line in FIG. 13.

In the configuration of FIG. 13 and FIG. 14, the transparent electrode 2 which is typically formed of the abovementioned ITO as the first electrode layer is formed to be stripes-shaped at the upper surface of the substrate 1. Then, isolation layers 11 are formed lattice-shaped between the transparent electrodes 2 which are formed stripes-shaped and in the direction perpendicular thereto. Thus, a pixel is constituted by the part which is surrounded by the lattice.

Further, a negative electrode partition 12 which is shaped to be a reversed isosceles trapezoid is formed on the isolation layer 11 which is perpendicular to the stripes-shaped transparent electrodes 2. Then, the dot-shaped conductor 3 is respectively arranged on the transparent electrode 2 at the approximate center surrounded by the lattice of the isolation layers 11. In addition, the insulation film 4 is formed in order to cover the dot-shaped conductor 3.

The light emitting functional layer 5 which includes organic material is formed, for example, by vapor deposition to this state. The light emitting functional layer 5 is formed as being separated into stripes by the negative electrode partitions 12 which are shaped to be reversed isosceles trapezoids. The light emitting functional layer 5 is formed also on the dot-shaped conductor 3 and the insulation film 4 which are arranged at the pixel positions. Further, the back surface electrode 6 as the second electrode layer is formed by vapor deposition, for example. The back surface electrode 6 is also formed as being separated into stripes by the negative electrode partitions 12 which are shaped to be reversed isosceles trapezoids.

Accordingly, the transparent electrode 2 as the first electrode layer and the back surface electrode 6 as the second electrode layer are formed in the directions to be perpendicular to each other. The pixel with the light emitting functional layer 5 is formed at the intersecting position. In addition, the dot-shaped conductor 3 is arranged on the transparent electrode 2 at the center position of each of the pixels.

With the abovementioned passive matrix type organic electroluminescence panel, the plurality of dot-shaped conductors 3 which are made of low electric resistivity material are arranged along and on the transparent electrode 2. Accordingly, the dot-shaped conductors 3 function as electrical bypass means at the transparent electrode 2. Therefore, in the embodiment of FIG. 13 and FIG. 14, voltage drop occurred at the transparent electrode 2 of high electric resistivity can be also effectively suppressed so as to contribute to decrease the degree of occurrence of luminance decrement caused by the voltage drop.

Here, in the abovementioned embodiments, the dot-shaped conductors 3 are all described to be circular as examples. However, the dot-shaped conductors 3 may be oval or square so that similar effects can be obtained.

What is claimed is:

1. A light emitting apparatus comprising:
   a substrate;
   a first electrode layer which is formed on the substrate;
   a light emitting functional layer which is formed on the first electrode layer and which includes organic material;
   a second electrode layer which is formed on the light emitting functional layer; and
   dot-shaped conductors which are connected to the first electrode layer, wherein
   the dot-shaped conductors are arranged so that a plurality of the dot-shaped conductors are respectively connected to the individual first electrode layer in a state that the dot-shaped conductors are separated from one another;
   each of the dot-shaped conductors is arranged on one surface of the first electrode layer,
   an area of each of the dot-shaped conductors varies in accordance with distance from one end part of the first electrode layer,
   at least a part of each of the dot-shaped conductors is covered by an insulation film and the insulation films which cover a plurality of the dot-shaped conductors are formed in a state of being separated from one another, and
   an edge part of each of the dot-shaped conductors is covered by the insulation film.

2. A light emitting apparatus comprising:
   a substrate;
   a first electrode layer which is formed on the substrate;
   a light emitting functional layer which is formed on the first electrode layer and which includes organic material;
   a second electrode layer which is formed on the light emitting functional layer; and
   dot-shaped conductors which are connected to the first electrode layer, wherein
   the dot-shaped conductors are arranged so that a plurality of the dot-shaped conductors are respectively connected to the individual first electrode layer in a state that the dot-shaped conductors are separated from one another,
   each of the dot-shaped conductors is arranged on one surface of the first electrode layer,
   a thickness of each of the dot-shaped conductors varies in accordance with distance from one end part of the first electrode layer,
   at least a part of each of the dot-shaped conductors is covered by an insulation film and the insulation films which cover a plurality of the dot-shaped conductors are formed in a state of being separated from one another, and an edge part of each of the dot-shaped conductors is covered by the insulation film.

3. The light emitting apparatus comprising:

a substrate;

a first electrode layer which is formed on the substrate;

a light emitting functional layer which is formed on the first electrode layer and which includes organic material;

a second electrode layer which is formed on the light emitting functional layer; and dot-shaped conductors which are connected to the first electrode layer, wherein the dot-shaped conductors are arranged so that a plurality of the dot-shaped conductors are respectively connected to the individual first electrode layer in a state that the dot-shaped conductors are separated from one another, each of the dot-shaped conductors is arranged on one surface of the first electrode layer, the number of the dot-shaped conductors arranged per unit area of the first electrode layer varies in accordance with distance from one end part of the first electrode layer, at least a part of each of the dot-shaped conductors is covered by an insulation film and the insulation films which cover a plurality of the dot-shaped conductors are formed in a state of being separated from one another, and an edge part of each of the dot-shaped conductors is covered by the insulation film.

4. The light emitting apparatus according to claim 1, wherein each of the dot-shaped conductors is configured to be a thin film shape through which a part of light emitted from the light emitting functional layer penetrates.

5. The light emitting apparatus according to claim 2, wherein each of the dot-shaped conductors is configured to be a thin film shape through which a part of light emitted from the light emitting functional layer penetrates.

6. The light emitting apparatus according to claim 3, wherein each of the dot-shaped conductors is configured to be a thin film shape through which a part of light emitted from the light emitting functional layer penetrates.

7. A light emitting apparatus comprising:

a substrate;

a first electrode layer which is formed on the substrate;

a light emitting functional layer which is formed on the first electrode layer and which includes organic material;

a second electrode layer which is formed on the light emitting functional layer; and dot-shaped conductors which are connected to the first electrode layer, wherein the dot-shaped conductors are arranged so that a plurality of the dot-shaped conductors are respectively connected to the individual first electrode layer in a state that the dot-shaped conductors are separated from one another, each of the dot-shaped conductors is arranged on one surface of the first electrode layer, at least a part of each of the dot-shaped conductors is covered by an insulation film and the insulation films which cover a plurality of the dot-shaped conductors are formed in a state of being separated from one another, and an area of each of the insulation films varies in accordance with distance from one end part of the first electrode layer.

8. A light emitting apparatus comprising:

a substrate;

a first electrode layer which is formed on the substrate;

a light emitting functional layer which is formed on the first electrode layer and which includes organic material;

a second electrode layer which is formed on the light emitting functional layer; and dot-shaped conductors which are connected to the first electrode layer, wherein the dot-shaped conductors are arranged so that a plurality of the dot-shaped conductors are respectively connected to the individual first electrode layer in a state that the dot-shaped conductors are separated from one another, each of the dot-shaped conductors is arranged on one surface of the first electrode layer, at least a part of each of the dot-shaped conductors is covered by an insulation film and the insulation films which cover a plurality of the dot-shaped conductors are formed in a state of being separated from one another, an area of each of the insulation films varies in accordance with distance from one end part of the first electrode layer, at least a part of each of the dot-shaped conductors is covered by an insulation film and the insulation films which cover a plurality of the dot-shaped conductors are formed in a state of being separated from one another, and an edge part of each of the dot-shaped conductors is covered by the insulation film.

\* \* \* \* \*